US010720491B2

(12) United States Patent
Yoon et al.

(10) Patent No.: US 10,720,491 B2
(45) Date of Patent: *Jul. 21, 2020

(54) METHOD OF FABRICATING SEMICONDUCTOR DEVICES

(71) Applicant: Samsung Electronics Co., Ltd., Suwon-si (KR)

(72) Inventors: Jun Ho Yoon, Suwon-si (KR); Won Chul Lee, Seongnam-si (KR); Sung Yeon Kim, Jeongeup-si (KR); Jae Hong Park, Seongnam-si (KR); Chan Hoon Park, Osan-si (KR); Yong Moon Jang, Incheon (KR); Je Woo Han, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/419,153

(22) Filed: May 22, 2019

(65) Prior Publication Data

US 2019/0273130 A1 Sep. 5, 2019

Related U.S. Application Data

(63) Continuation of application No. 15/626,271, filed on Jun. 19, 2017, now Pat. No. 10,319,805.

(30) Foreign Application Priority Data

Oct. 18, 2016 (KR) .................. 10-2016-0134918

(51) Int. Cl.
*H01L 21/28* (2006.01)
*H01L 21/283* (2006.01)
(Continued)

(52) U.S. Cl.
CPC ............ *H01L 28/60* (2013.01); *H01L 21/033* (2013.01); *H01L 21/283* (2013.01);
(Continued)

(58) Field of Classification Search
CPC ............... H01L 21/02; H01L 21/02104; H01L 21/02107; H01L 21/02109;
(Continued)

(56) References Cited

U.S. PATENT DOCUMENTS 6,455,436 B1 * 9/2002 Ueda ................. H01L 21/31144
257/E21.257
6,767,825 B1 * 7/2004 Wu .................... H01L 21/31116
257/E21.252
(Continued)

FOREIGN PATENT DOCUMENTS

KR 10-0911864 8/2009

*Primary Examiner* — Maliheh Malek
(74) *Attorney, Agent, or Firm* — Muir Patent Law, PLLC

(57) ABSTRACT

Provided is a method of fabricating a semiconductor device. The method includes forming an oxide film on a target layer, forming a first mask film on the oxide film, wherein the first mask film contains a semiconductor material and has a first thickness and a first etch selectivity with respect to the oxide film, forming a second mask film on the first mask film, wherein the second mask film contains a metal and has a second thickness smaller than the first thickness and a second etch selectivity larger than the first etch selectivity with respect to the oxide film, forming a second mask film pattern by patterning the second mask film, forming a first mask film pattern by patterning the first mask film, etching some portions of the oxide film by using the second mask film pattern as an etch mask film, and etching the rest of the oxide film by using the first mask film pattern as an etch mask film to form a hole, wherein the target layer is exposed via the hole.

20 Claims, 15 Drawing Sheets

(51) Int. Cl.
  *H01L 21/311*   (2006.01)
  *H01L 49/02*   (2006.01)
  *H01L 21/033*   (2006.01)
  *H01L 21/3205*   (2006.01)
  *H01L 21/8242*   (2006.01)
  *H01L 21/306*   (2006.01)

(52) U.S. Cl.
  CPC .. *H01L 21/31105* (2013.01); *H01L 21/31144*
    (2013.01); *H01L 21/30604* (2013.01); *H01L*
    *21/31116* (2013.01)

(58) Field of Classification Search
  CPC ......... H01L 21/02112; H01L 21/02123; H01L
    21/02126; H01L 21/02129; H01L
    21/0214; H01L 21/02161; H01L
    21/033–0338; H01L 21/2048–0495; H01L
    21/28–28105; H01L 21/02205–02219;
    H01L 21/02225–02244; H01L 21/30604;
    H01L 21/30608; H01L 21/30625; H01L
    21/3065; H01L 21/308–31155; H01L
    21/32; H01L 21/32133; H01L 21/32134;
    H01L 21/32135; H01L 21/32136; H01L
    21/32137; H01L 21/32139; H01L
    21/44–449; H01L 21/02142; H01L
    21/02153; H01L 21/02164; H01L
    21/0217; H01L 21/02172; H01L
    21/02186; H01L 21/027; H01L
    21/306–30621
  See application file for complete search history.

(56) References Cited

U.S. PATENT DOCUMENTS

| | | | |
|---|---|---|---|
| 8,071,485 B2 * | 12/2011 | Lee ..................... | H01L 21/0337 438/700 |
| 9,018,103 B2 * | 4/2015 | Guha ................ | H01L 21/31144 438/717 |
| 9,236,291 B2 * | 1/2016 | Usami ............... | H01L 21/02592 |
| 2004/0102041 A1 * | 5/2004 | Okudaira ........... | H01L 21/0332 438/689 |
| 2008/0044971 A1 * | 2/2008 | Kang .................... | H01L 28/91 438/253 |
| 2010/0267215 A1 * | 10/2010 | Park .................... | H01L 27/0207 438/397 |
| 2012/0086014 A1 * | 4/2012 | Kim .................... | H01L 28/90 257/76 |
| 2012/0086060 A1 * | 4/2012 | Taniguchi ......... | H01L 21/76232 257/296 |
| 2013/0164922 A1 * | 6/2013 | Cho ...................... | H01L 21/308 438/510 |
| 2014/0054754 A1 * | 2/2014 | Watanabe .......... | H01L 21/76814 257/635 |
| 2014/0113438 A1 * | 4/2014 | Usami ............... | H01L 21/02592 438/482 |
| 2014/0154863 A1 * | 6/2014 | Seo ..................... | H01L 28/90 438/386 |
| 2014/0327080 A1 * | 11/2014 | Hung ................ | H01L 29/66515 257/365 |
| 2014/0342553 A1 * | 11/2014 | Chen ................ | H01L 21/76897 438/666 |
| 2015/0097293 A1 * | 4/2015 | Yao ................... | H01L 21/76802 257/773 |
| 2015/0111360 A1 * | 4/2015 | Kim .................. | H01L 27/10855 438/381 |
| 2015/0115409 A1 * | 4/2015 | Hsu ....................... | H01L 28/90 257/535 |
| 2015/0145100 A1 * | 5/2015 | Hsu ................... | H01L 27/10814 257/532 |
| 2015/0162282 A1 * | 6/2015 | Pan .................... | H01L 21/76834 257/774 |
| 2015/0364366 A1 * | 12/2015 | Kim .................. | H01L 21/76816 438/396 |
| 2016/0005625 A1 * | 1/2016 | Shin ..................... | C08G 83/001 438/703 |
| 2016/0020213 A1 * | 1/2016 | Kim .................. | H01L 27/10885 438/381 |
| 2016/0035742 A1 * | 2/2016 | Kanakamedala .......................... H01L 27/11582 438/264 |
| 2016/0049407 A1 * | 2/2016 | Son ................... | H01L 27/10814 438/270 |
| 2016/0104618 A1 * | 4/2016 | Hong ................ | H01L 21/31116 438/396 |
| 2016/0190287 A1 * | 6/2016 | Hsu .................. | H01L 21/31144 438/299 |
| 2017/0004996 A1 * | 1/2017 | Briggs ............. | H01L 21/76816 |
| 2017/0103892 A1 * | 4/2017 | Seo ..................... | H01L 21/0337 |
| 2017/0162434 A1 * | 6/2017 | Oh ....................... | H01L 21/0332 |
| 2018/0358262 A1 * | 12/2018 | Lu ..................... | H01L 21/76807 |
| 2018/0366468 A1 * | 12/2018 | Park ....................... | H01L 22/34 |
| 2019/0027376 A1 * | 1/2019 | Yoon ..................... | H01L 21/304 |
| 2019/0122982 A1 * | 4/2019 | Hourani ............ | H01L 21/76816 |
| 2019/0148221 A1 * | 5/2019 | Peng .................. | H01L 21/31144 257/758 |
| 2020/0006123 A1 * | 1/2020 | Peng .................. | H01L 21/31144 |

* cited by examiner

METHOD OF FABRICATING SEMICONDUCTOR DEVICES

This application is a continuation of U.S. patent application Ser. No. 15/626,271, filed Jun. 19, 2017, in the U.S. Patent and Trademark Office (USPTO), which claims the benefit of priority under 35 U.S.C. § 119 from Korean Patent Application No. 10-2016-0134918, filed on Oct. 18, 2016, in the Korean Intellectual Property Office, the disclosures of both of which are incorporated herein by reference in their entireties.

BACKGROUND

1. Field of the Disclosure

The present disclosure relates to a method of fabricating a semiconductor device.

2. Description of the Related Art

So far, semiconductor devices have evolved so that they are driven with lower voltage but operate faster. In addition, the process of fabricating semiconductor devices has continued to increase the degree of integration. Accordingly, in a high integration semiconductor device in a large scale, patterns have a micro-width and are spaced apart from one another by a fine pitch.

As semiconductor devices become finer, pitches between holes, contacts or capacitors become increasingly narrow, and accordingly it is inevitable to form features having a high aspect ratio. Such features having a high aspect ratio may include capacitors in a DRAM, channels in a vertical NAND (VNAND), and metal contacts formed in a variety of semiconductor devices.

In a DRAM device, for example, as the aspect ratio of the lower electrode of a capacitor has increased, there have been proposed many methods for forming holes having a high aspect ratio in which the capacitor is formed.

SUMMARY

Aspects of the present disclosure provide a method of fabricating a semiconductor device that includes a hole in which a capacitor having a high aspect ratio is formed by using different types of masks.

In some embodiments, the disclosure is directed to a method of fabricating a semiconductor device, the method comprising: forming an oxide film on a target layer; forming a first mask film on the oxide film, wherein the first mask film contains a semiconductor material and has a first thickness and a first etch selectivity with respect to the oxide film; forming a second mask film on the first mask film, wherein the second mask film contains a metal and has a second thickness smaller than the first thickness and a second etch selectivity with respect to the oxide film larger than the first etch selectivity; forming a second mask film pattern by patterning the second mask film; forming a first mask film pattern by patterning the first mask film; etching first portions of the oxide film by using the second mask film pattern as a first etch mask film; and etching second portions of the oxide film by using the first mask film pattern as a second etch mask film to form a hole, wherein the target layer is exposed via the hole.

In some embodiments, the disclosure is directed to a method of fabricating a semiconductor device, the method comprising: forming an isolating film to define an active area in a substrate; forming a gate in the active area; forming an interlayer insulation film on the substrate, a bit line feature, and a landing pad in the interlayer insulation film, wherein the landing pad is electrically connected to the active area; forming an oxide film on the interlayer insulation film; forming a first mask film pattern on the oxide film and a second mask film pattern on the first mask film pattern; forming a first hole penetrating the oxide film to a depth by using the second mask film pattern; forming a second hole by etching a remaining portion of the oxide film by using the first mask film pattern, wherein the landing pad is exposed via the second hole; and forming a capacitor electrically connected to the landing pad via the second hole.

In some embodiments, the disclosure is directed to a method of fabricating a semiconductor device, the method comprising: forming an oxide film on an interlayer insulation film; forming a first mask film on the oxide film, wherein the first mask film has a first thickness and a first etch selectivity with respect to the oxide film; forming a second mask film on the first mask film, wherein the second mask film has a second thickness and a second etch selectivity with respect to the oxide film; forming a second mask film pattern by patterning the second mask film; forming a first mask film pattern by patterning the first mask film; forming a first hole penetrating the oxide film to a depth by using the second mask film pattern as a first etch mask; forming a second hole by etching a remaining portion of the oxide film by using the first mask film pattern as a second etch mask, wherein a landing pad in the interlayer insulation film is exposed via the second hole; and forming a capacitor electrically connected to the landing pad via the second hole, wherein the first thickness is larger than the second thickness and the first etch selectivity is smaller than the second etch selectivity.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
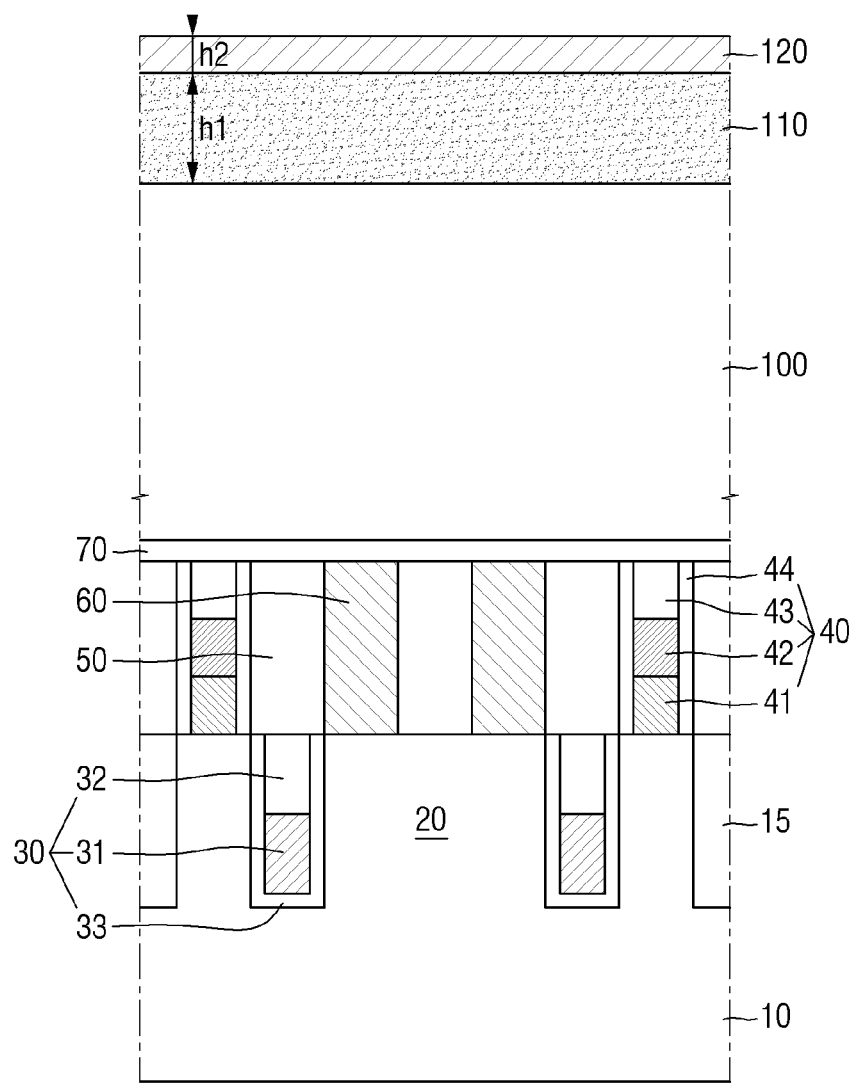
FIGS. 1 to 7 are cross-sectional views showing processing steps of a method of fabricating a semiconductor device according to an exemplary embodiment of the present disclosure.

The various pads described herein may be connected to internal circuitry within the device to which they are connected, and may transmit signals and/or voltage to and/or from the device to which they are attached. For example, substrate pads disposed on the package substrate may connect to rerouting and other electrical lines disposed within the package substrate, and the pads disposed on the semiconductor chips may connect to an integrated circuit on one or more of the semiconductor chips. The various pads described herein may generally have a planar surface at a location for connecting to a terminal for external communications outside of the device to which the pads are connected. The pads may be formed of a conductive material, such a metal, for example.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

FIGS. 1 to 7 are cross-sectional views for illustrating processing steps of a method of fabricating a semiconductor device according to an exemplary embodiment of the present disclosure.

Referring to FIG. 1, a method of fabricating a semiconductor device according to an exemplary embodiment of the present disclosure includes forming an isolating film 15 on a substrate 10 to define an active area 20; and forming a gate 30 buried in the active area 20. The method may further include forming an interlayer insulation film on a target layer, where a target layer refers to a lower layer on which interlayer insulation film is formed and may include one or more patterns or layers to form the target layer. For example, the method may include forming the interlayer insulation film 50 on the isolating film 15 and the buried gate 30; forming a bit line feature 40 and a landing pad 60 in the interlayer insulation film 50, and sequentially forming a stopping insulation film 70, an oxide film 100, a first mask film 110 and a second mask film 120 on the interlayer insulation film 50. The substrate 10 may be, for example, a bulk silicon substrate or a SOI (silicon-on-insulator) substrate. Alternatively, the substrate 10 may be a silicon substrate or may be a substrate made of other materials, such as silicon germanium (SiGe), indium antimonide (InSb), lead-telluride (PbTe) compound, indium arsenide (InAs), indium phosphide (InP), gallium arsenide (GaAs) and gallium antimonide (GaSb). Alternatively, the substrate 10 may be formed by growing an epitaxial layer on a base substrate. In the following exemplary description, the substrate 10 is a silicon substrate.

The isolating film 15 may be formed in the substrate 10 to define the active area 20. For example, the lower surface of the isolating film 15 may be lower than the upper surface of the substrate 10, to define the active area 20. In some embodiments, an upper surface of the isolating film 15 may be at the same vertical level as the upper surface of the substrate 10. The isolating film 15 may include one of an oxide film, an oxynitride film and a nitride film, for example.

Forming a buried gate may include forming a trench in the active area 20, and forming a gate insulation film 33, a gate electrode 31 and a gate capping film 32 in the trench.

The gate electrode 31 may include a conductive material, for example. Examples of such a conductive material may include, but are not limited to, doped polysilicon, titanium nitride (TiN), tantalum nitride (TaN), tungsten nitride (WN), titanium (Ti), tantalum (Ta), tungsten (W), etc.

The gate capping film 32 may include one of silicon oxide, silicon nitride and silicon oxynitride.

The gate insulation film 33 may include, but is not limited to, an oxide film. For example, the gate insulation film 33 may include a high-k dielectric film such as hafnium oxide, hafnium silicon oxide, lanthanum oxide, lanthanum aluminum oxide. The gate insulation film 33 may surround the gate electrode 31 and the gate capping film 32. For example, the gate insulation film 33 may be formed on the surfaces of the trench, and the gate electrode 31 may be formed in a lower portion of the trench and the gate capping film 32 may be formed in an upper portion of the trench above the gate electrode 31.

The interlayer insulation film 50 may cover the upper surface of the substrate 10. The interlayer insulation film 50 may include an oxide film, for example. In addition, the interlayer insulation film 50 may surround the side surfaces of the bit line feature 40 and the landing pad 60.

Forming the bit line feature 40 comprises forming a bit line contact plug 41 on the substrate 10, forming a bit line electrode 42 on the bit line contact plug 41, forming a bit line capping film 43 on the bit line electrode 42, and forming a bit line spacer 44 on either side of the bit line contact plug 41, the bit line electrode 42 and the bit line capping film 43. The interlayer insulation film 50 may surround the side surfaces of the bit line spacer 44.

The bit line contact plug 41 may be, for example, formed by using an epitaxial growth process from the active area 20 of the substrate 10 to form single-crystal silicon. Alternatively, the bit line contact plug 41 may be formed on the active area 20 such that it includes a doped semiconductor material, a conductive metal nitride and a metal-semiconductor compound.

For example, the bit line electrode 42 may be formed on the bit line contact plug 41 such that it includes a conductive material such as tungsten. Although not shown in the drawings, a barrier film including a material such as titanium, titanium nitride, tantalum and tantalum nitride may be formed between the bit line electrode 42 and the bit line contact plug 41.

The bit line capping film 43 may be formed on the bit line electrode 42 such that it includes silicon nitride, for example. The bit line capping film 43 may serve as a mask used for patterning the line shapes of the bit line contact plug 41 and the bit line electrode 42.

The bit line spacer 44 may be formed, for example, by depositing silicon nitride on the side surfaces of a feature in which the bit line contact plug 41, the bit line electrode 42 and the bit line capping film 43 are stacked one on another.

Forming the landing pad 60 may include filling the trench formed in the interlayer insulation film 50 with a doped semiconductor material such as tungsten, a conductive metal nitride, a metal and a metal-semiconductor compound. Alternatively, the landing pad 60 may be formed by using an epitaxial growth process from the active area 20 of the substrate 10 to form single-crystal silicon. Doped regions are formed in the active area 20 in contact with the landing pad 60, which may server as source/drain regions.

Forming the stopping insulation film 70 may include forming silicon nitride, for example, on the interlayer insulation film 50, the bit line feature 40 and the landing pad 60 via a deposition process. The stopping insulation film 70 may include a material having an etch selectivity with respect to the interlayer insulation film 50 and the oxide film 100.

Forming the oxide film 100 may include forming silicon nitride on the stopping insulation film 70, for example, via a deposition process. In some exemplary embodiments, the oxide film 100 may be thicker than the stopping insulation film 70.

The first mask film 110 may be formed on the oxide film 100. In some exemplary embodiments of the present disclosure, the first mask film 110 may be a silicon mask film. More specifically, the first mask film 110 may include silicon or doped silicon. For example, the first mask film 110 may include silicon doped with one of boron (B), carbon (C) and phosphorus (P).

Forming the first mask film 110 on the oxide film 100 may include forming the above-described materials, e.g., via oxide film growth (diffusion), chemical vapor deposition (CVD).

The second mask film 120 may be formed on the first mask film 110. In some exemplary embodiments of the present disclosure, the second mask film 120 may be a metal mask film. More specifically, the second mask film 120 may include, but is not limited to, tungsten (W), tungsten nitride (WN), tungsten carbide (WC), aluminum (Al), aluminum oxide ($Al_2O_3$), titanium (Ti), titanium oxide (TiO), tungsten silicide (WSi), etc.

Forming the second mask film 120 may include depositing the above-described material on the first mask film 110, e.g., via physical vapor deposition (PVD), CVD, etc.

The first mask film 110 and the second mask film 120 may be used as etch masks during an etching process of the oxide film 100 to be described below. The first mask film 110 may have a first etch selectivity with respect to the oxide film 100, while the second mask film 120 may have a second etch selectivity with respect to the oxide film 100. In some embodiments of the present disclosure, the second etch selectivity may be larger than the first etch selectivity. For example, in some embodiments, during an etch process of the oxide film 100, the second mask film 120 including a metal mask film has an etch resistance larger than that of the first mask film 110 including a silicon mask film.

As shown in FIG. 1, the first mask film 110 may have a first thickness h1, and the second mask film 120 may have a second thickness h2. The first thickness h1 of the first mask film 110 may be larger than the second thickness h2 of the second mask film 120. For example, the first thickness h1 of the first mask film 110 may be approximately twice to three times the second thickness h2 of the second mask film 120. Thickness may refer to the thickness or height measured in a direction perpendicular to a top surface of the substrate 10.

In some embodiments, the first thickness h1 of the first mask film 110 may be between approximately 3 to 6 kilo-Angstrom (kÅ), and the second thickness h2 of the second mask film 120 may be between approximately 1 to 3 ka.

As described above, the second etch selectivity of the second mask film 120 with respect to the oxide film 100 may be larger than the first etch selectivity of the first mask film 110. Accordingly, in order to etch the oxide film 100 to the same depth by using the first and second mask films during a subsequent etch process of the oxide film 100, the thickness of the first mask film 110 may be larger than the thickness of the second mask film 120.

Figure 2:
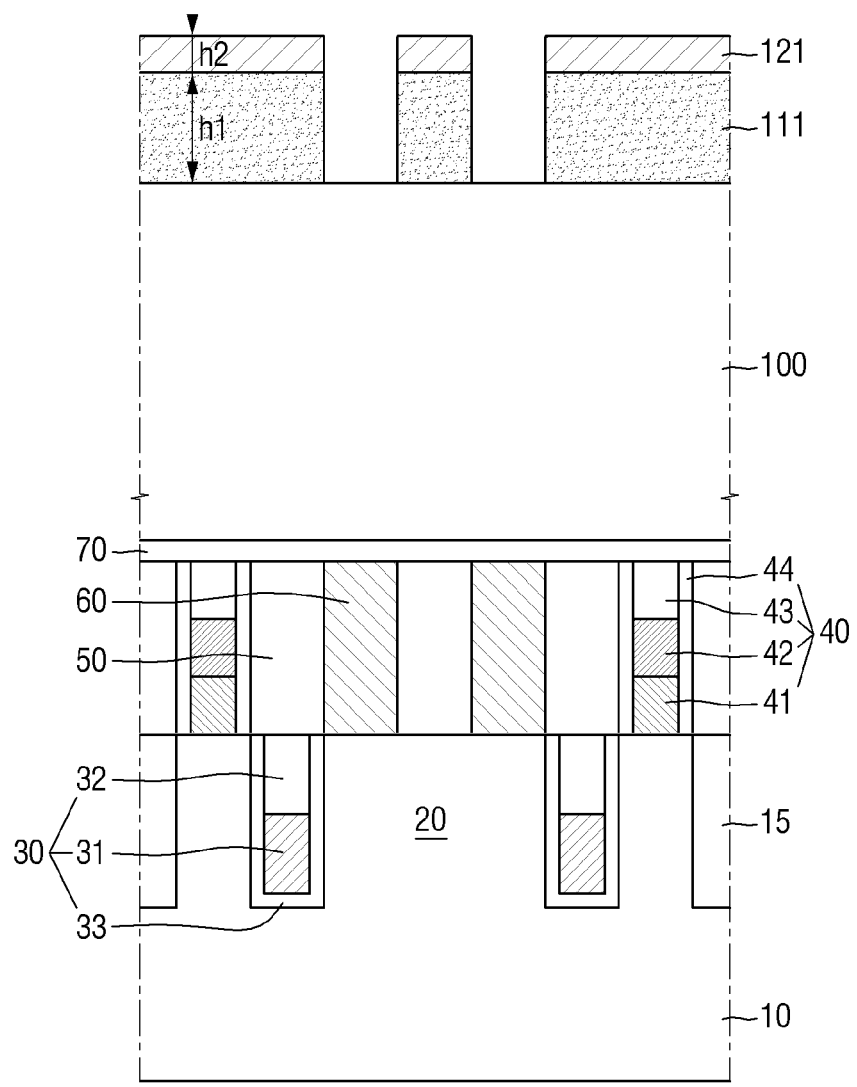

Referring to FIG. 2, by patterning the first mask film 110 and the second mask film 120, a first mask pattern 111 and a second mask pattern 121 may be formed. For example, patterning the first mask film 110 and the second mask film 120 may include forming a complex film including an oxide film, a carbon film and a capping film on the first mask film 110 and the second mask film 120, forming a complex pattern on the complex film via a photoresist process, forming the second mask pattern 121 and the first mask film pattern 111 by sequentially patterning the second mask film 120 and the first mask film 110 using the complex pattern as an etch mask.

Like the first mask film 110 and the second mask film 120, the first mask film pattern 111 may have the first thickness h1, and the second mask film pattern 121 may have the second thickness h2. Like the first mask film 110 and the second mask film 120, the first thickness h1 may be different from the second thickness h2. For example, the first thickness h1 of the first mask film pattern 111 may be approximately twice to three times the second thickness h2 of the second mask film pattern 121.

Some portions of the upper surface of the oxide film 100 may be exposed via the first mask film pattern 111 and the second mask film pattern 121. The exposed portions of the oxide film 100 may overlap the landing pad 60 at least partially. For example, when viewed in a plan view, the exposed portions of the oxide film 100 may overlap portions of the landing pad 60. This is because a process of forming a hole is carried out on the exposed portions of the oxide film 100 such that a capacitor in the hole is electrically connected to the landing pad 60.

Figure 3:
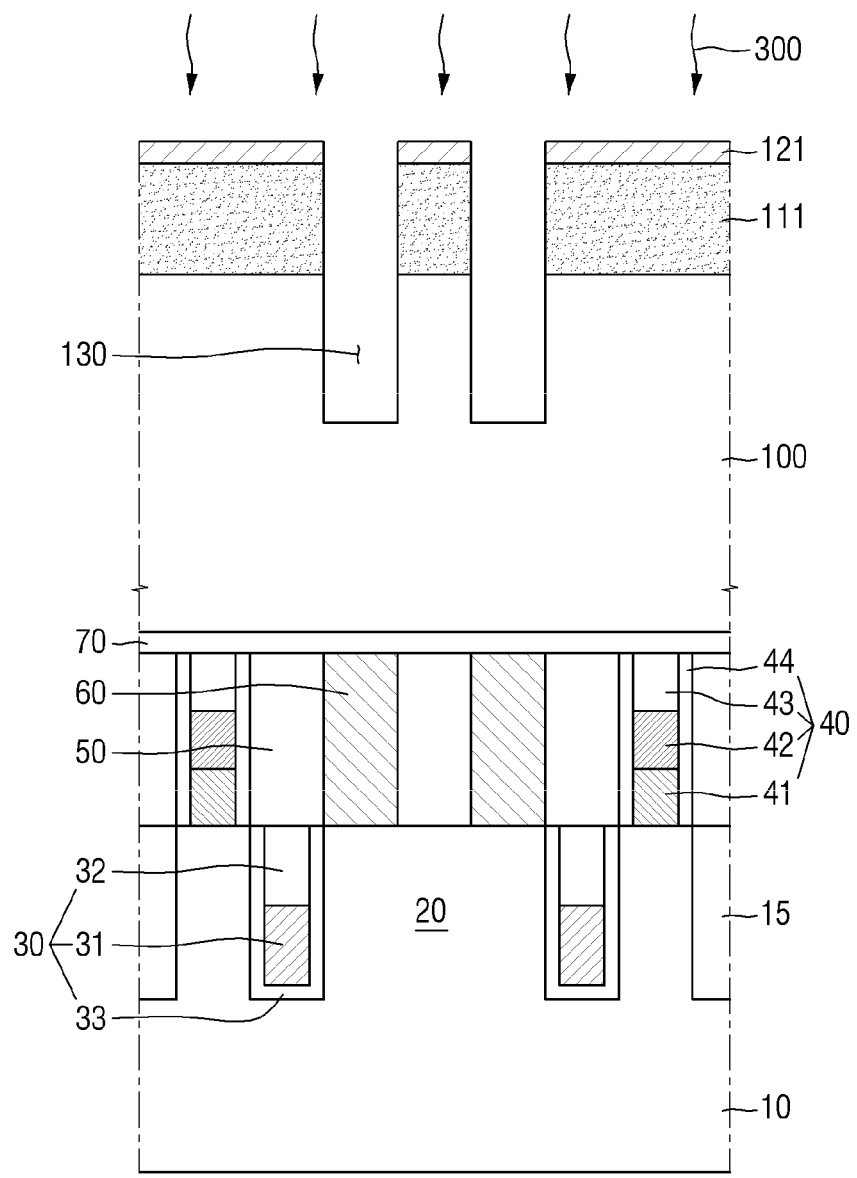

Referring to FIG. 3, a first etch process 300 of etching the oxide film 100 partially may be carried out by using the second mask film pattern 121 as an etch mask. As a result of the first etch process 300, a first hole 130 may be formed that penetrates the oxide film 100 to a depth.

During the first etch process 300, an etchant for etching the oxide film 100 may include, for example, $C_4F_8$ or $C_4F_6$ gas or a mixed gas thereof.

As a result of the first etch process 300, the second mask film pattern 121 may also be damaged, such that the thickness of the second mask film pattern 121 may be reduced. However, the second mask film pattern 121 may not be completely removed via the first etch process 300.

Figure 4:
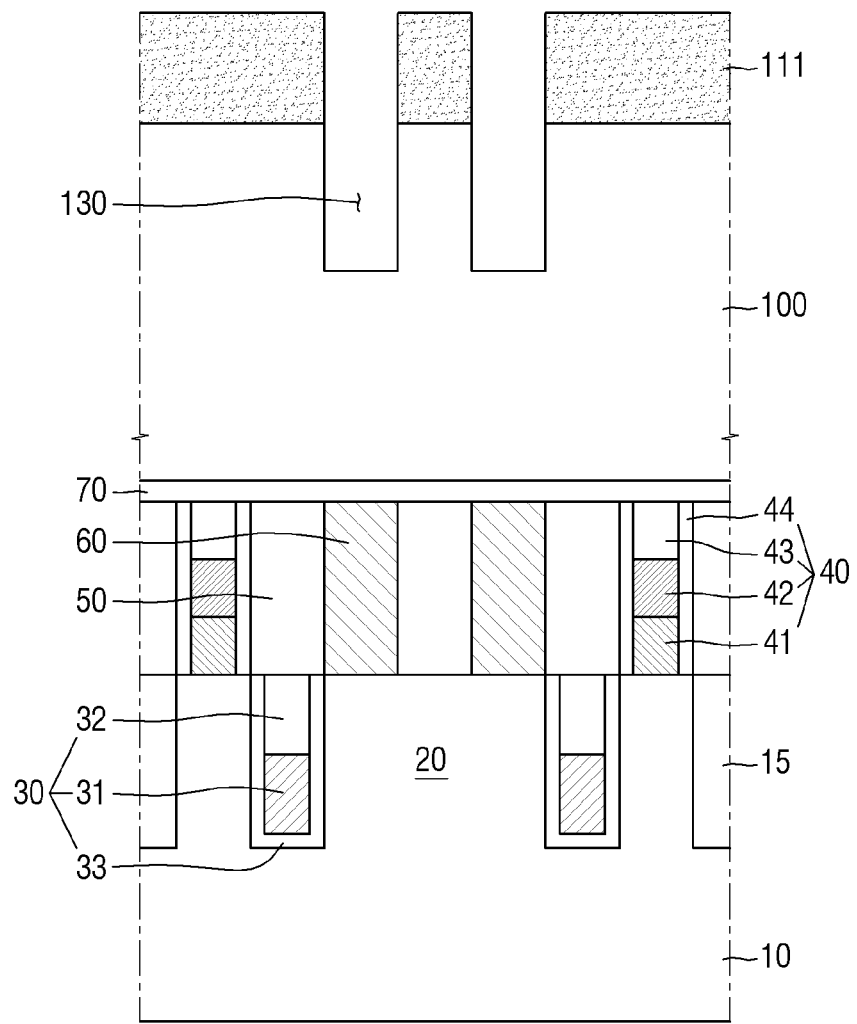

Referring to FIG. 4, the second mask film pattern 121 remaining on the first mask film pattern 111 after the first etch process 300 is completely removed. The second mask film pattern 121 may be removed by wet etching. Specifically, the second mask film pattern 121 may be removed by using a mixture of a hot sulfuric acid solution and a standard clean 1 (SC1) solution. By combining the wet etchants, the second mask film pattern 121 can be completely removed with no damage to the oxide film 100 and the first hole 130 in the oxide film 100.

As the second mask film pattern 121 is completely removed, the upper surface of the first mask film pattern 111 is exposed. Accordingly, the first mask film pattern 111 may be used as an etch mask during a subsequent process of further etching the oxide film 100.

Figure 5:
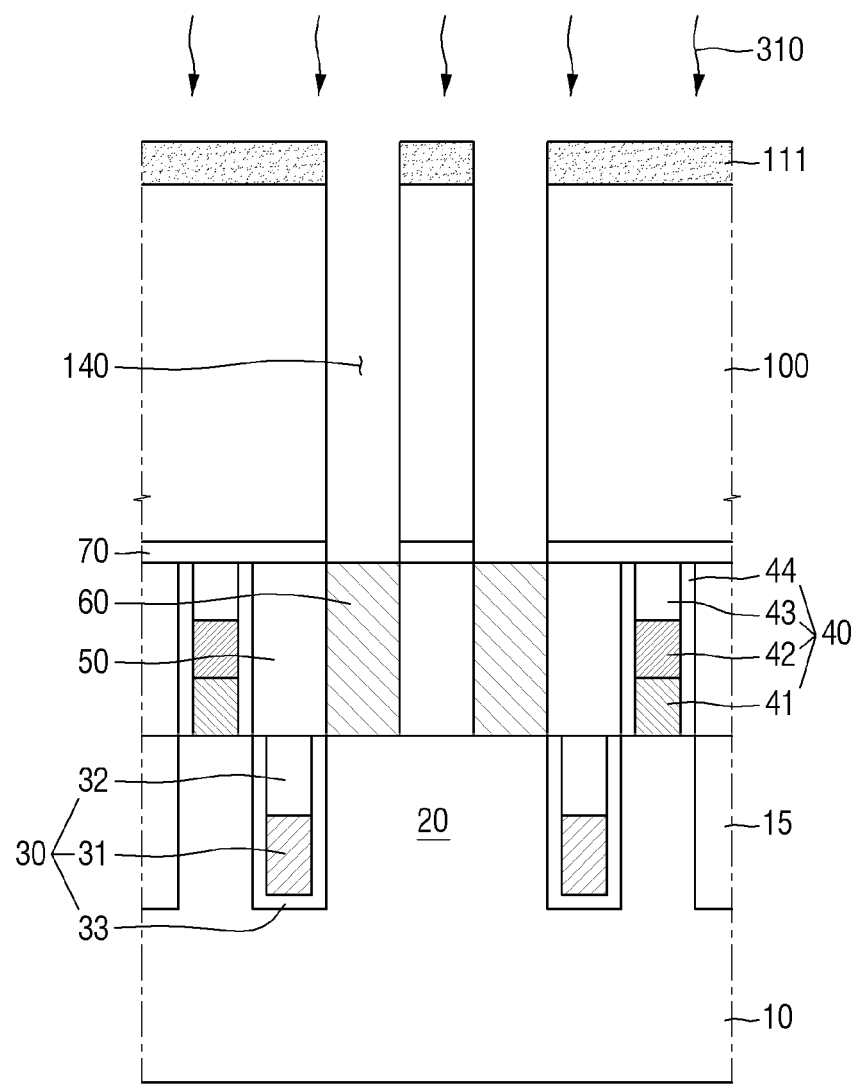

Referring to FIG. 5, a second etch process 310 of etching the rest of the oxide film 100 may be carried out by using the first mask film pattern 111 as an etch mask. As a result of the second etch process 310, a second hole 140 may be formed that penetrates the oxide film 100 completely.

Performing the second etch process 310 may include removing the stopping insulation film 70 under the oxide film 100. For example, the second etch process 310 may remove portions of the stopping insulation film 70 located in the area where the second hole 140 is formed. As the portions of the stopping insulation film 70 covering the landing pad 60 are removed, the upper surface of the landing pad 60 may be exposed.

During the second etch process 310, the first mask film pattern 111 may also be damaged, such that the thickness of the first mask film pattern 111 may be reduced.

During the second etch process 310, an etchant for etching the oxide film 100 and the stopping insulation film 70 may include, for example, $C_4F_8$ or $C_4F_6$ gas or a mixed gas thereof.

In the method of fabricating a semiconductor device according to the exemplary embodiment of the present disclosure, the oxide film 100 is etched by using the second mask film pattern 121 and the first mask film pattern 111 as etch masks sequentially. By using both of the first mask film pattern 111 and the second mask film pattern 121, it is possible to form the second hole 140 having a high aspect ratio.

Typically, when the oxide film 100 is etched by using only the first mask film pattern 111 including a silicon mask film, it may not be possible to form a hole to a desired depth since the etch selectivity of the first mask film pattern 111 with respect to the oxide film is insufficient. If the thickness of the first mask film pattern 111 is increased to obtain a sufficient etching depth, the first mask film pattern 111 may be tilted such that patterning may become defective.

On the other hand, when the oxide film 100 is etched by using only the second mask film pattern 121 including a metal mask film, the second mask film pattern 121 may have a sufficient etch selectivity with respect to the oxide film 100. However, the second mask film pattern 121 including a metal may not be evenly formed, such that critical dimensions (CD) of the holes in the oxide film 100 may not be uniform.

In the method of fabricating a semiconductor device according to the exemplary embodiment of the present disclosure, the first etch process 300 is carried out by using the second mask film pattern 121 having the second etch selectivity larger than the first etch selectivity of the first mask film pattern 111 with respect to the oxide film 100. By using the second etch selectivity of the second mask film pattern 121, the first hole 130 having a sufficient depth is formed in the oxide film 100.

Subsequently, the remaining second mask film pattern 121 is completely removed, and then the rest of the oxide film 100 is etched by using the first mask film pattern 111 as an etch mask, thereby forming the second hole 140 penetrating the oxide film 100.

By carrying out the first and second etch processes 300 and 310 by using both of the first mask film pattern 111 and the second mask film pattern 121, the thickness of the first mask film pattern 111 may be smaller than that of the first mask film pattern 111 when it is solely used, and accordingly the tilting of the first mask film pattern 111 can be suppressed.

On the other hand, as the rest of the oxide film 100 is etched by using the first mask film pattern 111 after the second mask pattern 121 is completely removed, it is possible to mitigate unevenness that may occur when the oxide film 100 is etched by using the second mask film pattern 121.

As a result, by the method of fabricating a semiconductor device according to the exemplary embodiment of the present disclosure, it is possible to form the second hole 140 having a high aspect ratio.

Figure 6:
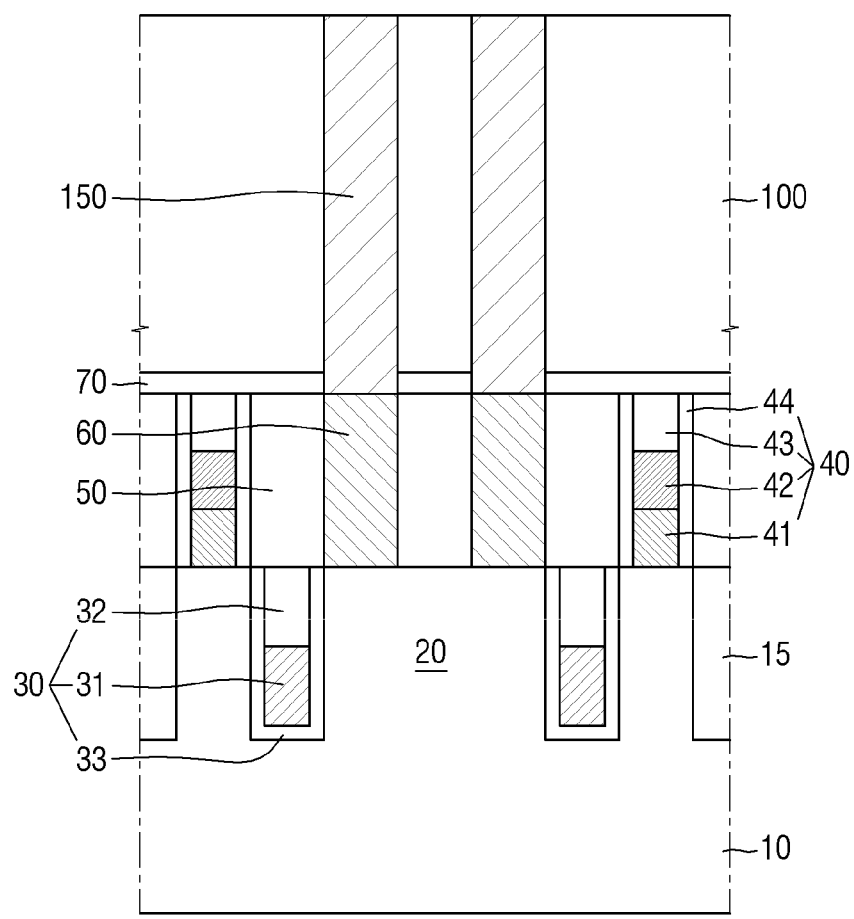

Subsequently, referring to FIG. 6, a lower electrode 150 is formed in the second hole 140. Forming the lower electrode 150 may include, for example, filling the second hole 140 with a conductive material, and then removing the conductive material on the upper surface of the oxide film 100 via an etch-back process or chemical mechanical polishing (CMP), etc.

Figure 7:
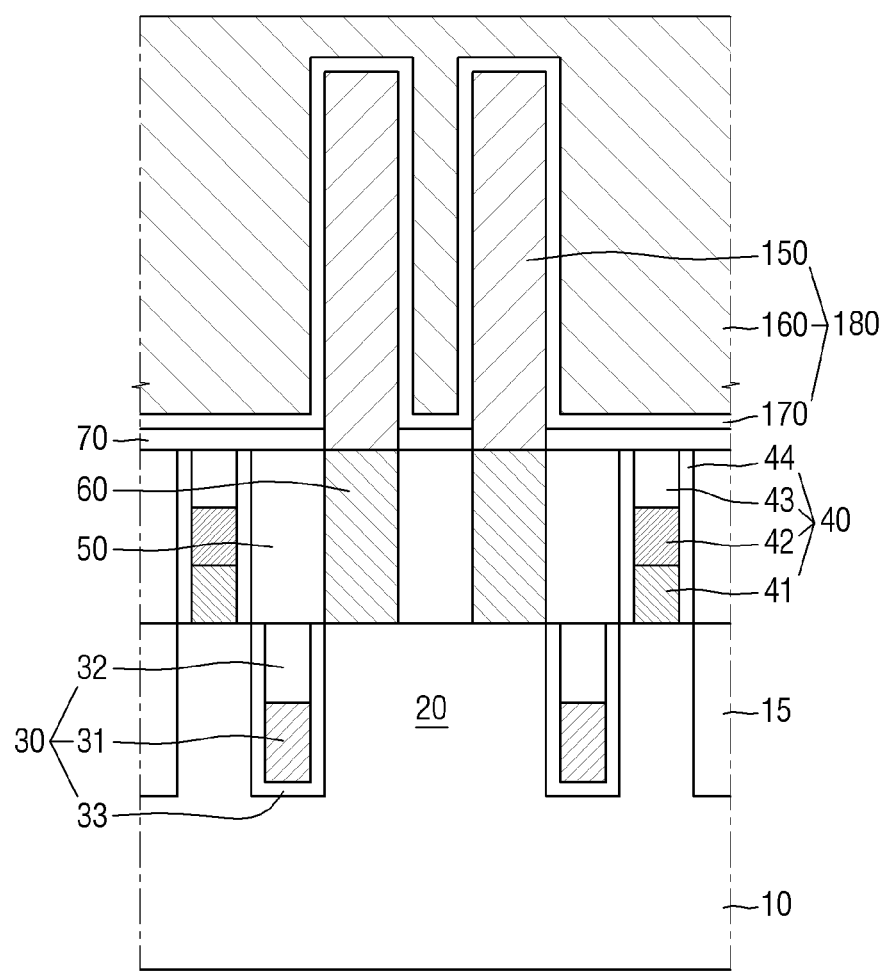

Referring to FIG. 7, the oxide film 100 around the lower electrode 150 is completely removed, a dielectric film 170 is formed conformally over the lower electrode 150 and the stopping insulation film 70, and an upper electrode 160 is formed such that it covers the dielectric film 170 and the lower electrode 150 to form a capacitor 180.

Like the etch process of the oxide film 100 described above, removing the oxide film 100 may include removing the oxide film 100 by using an etchant containing a $C_4F_8$ or $C_4F_6$ gas, or a mixed gas thereof.

Forming the dielectric film 170 may include, but is not limited to, forming a high-k material such as hafnium (Hf) or zirconium (Zr) conformally over the lower electrode 150 and the stopping insulation film 70. The dielectric film 170 may include, for example, at least one of hafnium oxide, hafnium silicon oxide, hafnium oxynitride, zirconium oxide, zirconium silicon oxide, tantalum oxide and titanium oxide.

Forming the upper electrode 160 may include forming a conductive material so that it covers the dielectric film 170 and the lower electrode 150. The upper electrode 160 may include a metal, a metal compound, or a combination thereof.

By forming the lower electrode 150, the upper electrode 160 and the dielectric film 170, the capacitor 180 is formed.

As described above, by the method of fabricating a semiconductor device according to the exemplary embodiment of the present disclosure, it is possible to form the second hole 140 having a high aspect ratio and the lower electrode 150 with which the second hole 140 is filled, thereby forming the capacitor 180 having a high aspect ratio. The capacitor 180 having a high aspect ratio can having increased capacitance and can improve the operation reliability of the semiconductor device.

FIGS. 8 to 15 are cross-sectional views for illustrating processing steps of a method of fabricating a semiconductor device according to another exemplary embodiment of the present disclosure. In the following description, like reference numerals may denote features analogous to those described in the above-described exemplary embodiment.

Figure 8:
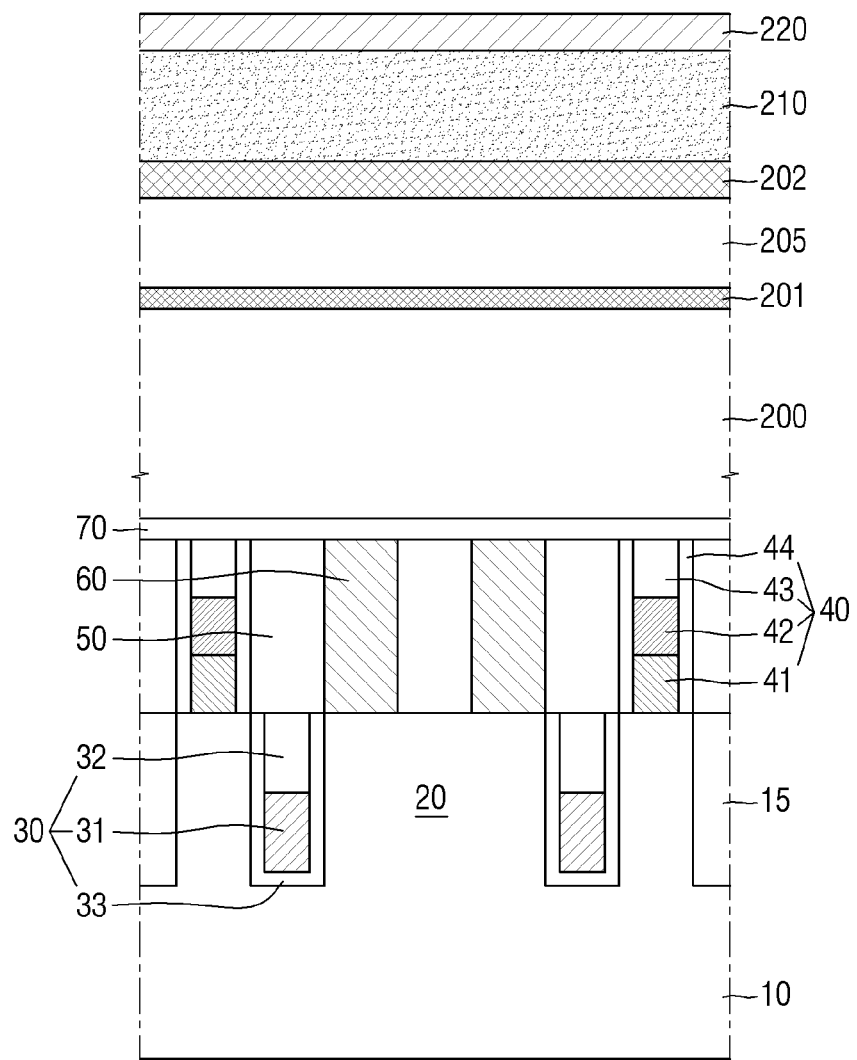
FIGS. 8 to 15 are cross-sectional views showing processing steps of a method of fabricating a semiconductor device according to another exemplary embodiment of the present disclosure.

Referring to FIG. 8, an active area 20 is defined in a substrate 10 by an isolating film 15, and a buried gate 30 is formed in the substrate 10. A landing pad 60, an interlayer insulation film 50 and a bit line feature 40 are formed on the substrate 10 and the buried gate 30. A stopping insulation film 70, a first oxide film 200, a lower supporter film 201, a second oxide film 205, an upper supporter film 202, a first mask film 210 and a second mask film 220 may be formed sequentially such that they cover the interlayer insulation film 50, the landing pad 60 and the bit line feature 40.

In the method of fabricating a semiconductor device according to this exemplary embodiment, the first oxide film 200 and the second oxide film 205 may include the same material. Specifically, both of the first oxide film 200 and the second oxide film 205 may include silicon oxide.

The lower supporter film 201 may be formed between the first oxide film 200 and the second oxide film 205. For example, the lower supporter film may be formed such that it is interposed between the first oxide film and the second oxide film. The lower supporter film 201 may be formed by depositing silicon nitride on the first oxide film 200, for example. In the semiconductor device fabricated by the method according to exemplary embodiment, the lower supporter film 201 may support electrodes of a capacitor, which will be described in detail below.

The upper supporter film 202 may be formed between the second oxide film 205 and the first mask film 210. For example, the upper supporter film may be formed such that it is interposed between the second oxide film and the first mask film. The upper supporter film 202 and the lower supporter film 201 may be formed by depositing the same material, but this is not limiting. Like the lower supporter film 201, the upper supporter film 202 may support electrodes of a capacitor included in the semiconductor device fabricated by the method according to the exemplary embodiment of the present disclosure.

The first mask film 210 and the second mask film 220 may be formed sequentially such that they cover the upper surface of the upper supporter film 202. For example, the first mask film 210 may be formed on the upper supporter film 202, and the second mask film 220 may be formed on the first mask film 210. As described above, the first mask film 210 may include silicon or may be a silicon film containing silicon doped with boron, carbon, phosphorus, etc.

Forming the first mask film 210 on the upper supporter film 202 may include forming the above-described materials via, e.g., oxide film growth (diffusion), chemical vapor deposition (CVD), etc.

The second mask film 220 may include, for example, at least one of tungsten, tungsten nitride, tungsten carbide, aluminum, aluminum oxide, titanium, titanium oxide, tungsten silicide, etc.

Forming the second mask film 220 may include depositing the above-described material on the first mask film 210 by, e.g., PVD, CVD, etc.

Like the above-described exemplary embodiment, the first mask film 210 may have a first thickness h1, and the second mask film 220 may have a second thickness h2 smaller than the first thickness h1. Specifically, the first thickness h1 of the first mask film 210 may be approximately twice to three times the second thickness h2 of the second mask film 220.

In addition, the etch selectivity of the second mask film 220 with respect to the oxide films 200 and 205 may be larger than the etch selectivity of the first mask film 210 with respect to the oxide films 200 and 205.

Figure 9:
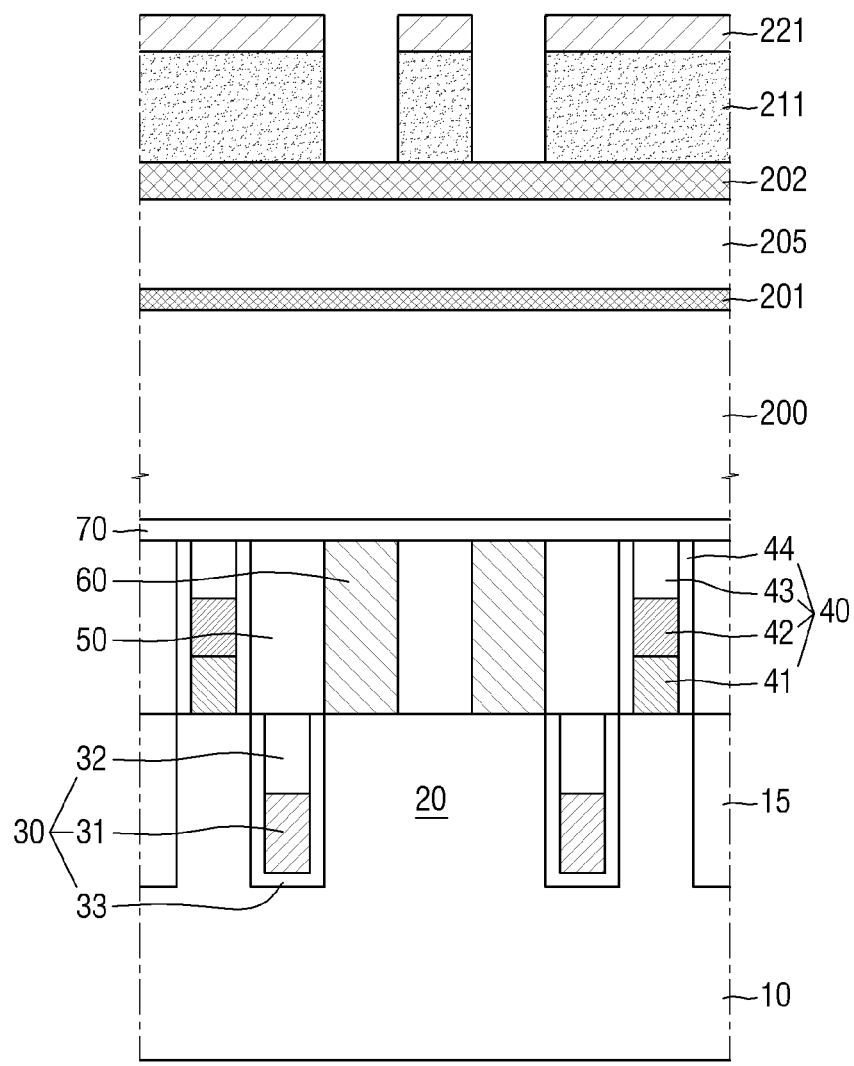

Referring to FIG. 9, by patterning the first mask film 210 and the second mask film 220, a first mask pattern 211 and a second mask pattern 221 may be formed. The first mask film pattern 211 may have the first thickness h1 like the first mask film 210, and the second mask film pattern 221 may have the second thickness h2 like the second mask film 220. The first thickness h1 of the first mask film pattern 211 may be larger than the second thickness h2 of the second mask film pattern 221. More specifically, the first thickness h1 of the first mask film pattern 211 may be approximately twice to three times the second thickness h2 of the second mask film pattern 221.

Some portions of the upper surface of the upper supporter film 202 may be exposed via the first mask film pattern 211 and the second mask film pattern 221. The exposed portions of the upper supporter film 202 may overlap the landing pad 60 at least partially. For example, when viewed in a plan view, the exposed portions of the upper supporter film 202 may overlap portions of the landing pad 60. This is because a process of forming a hole is carried out on the exposed portions of the upper supporter film 202, the first and second oxide films 200 and 205 located under the upper support film 202 and the lower supporter film 201, such that a capacitor in the hole is electrically connected to the landing pad 60.

Figure 10:
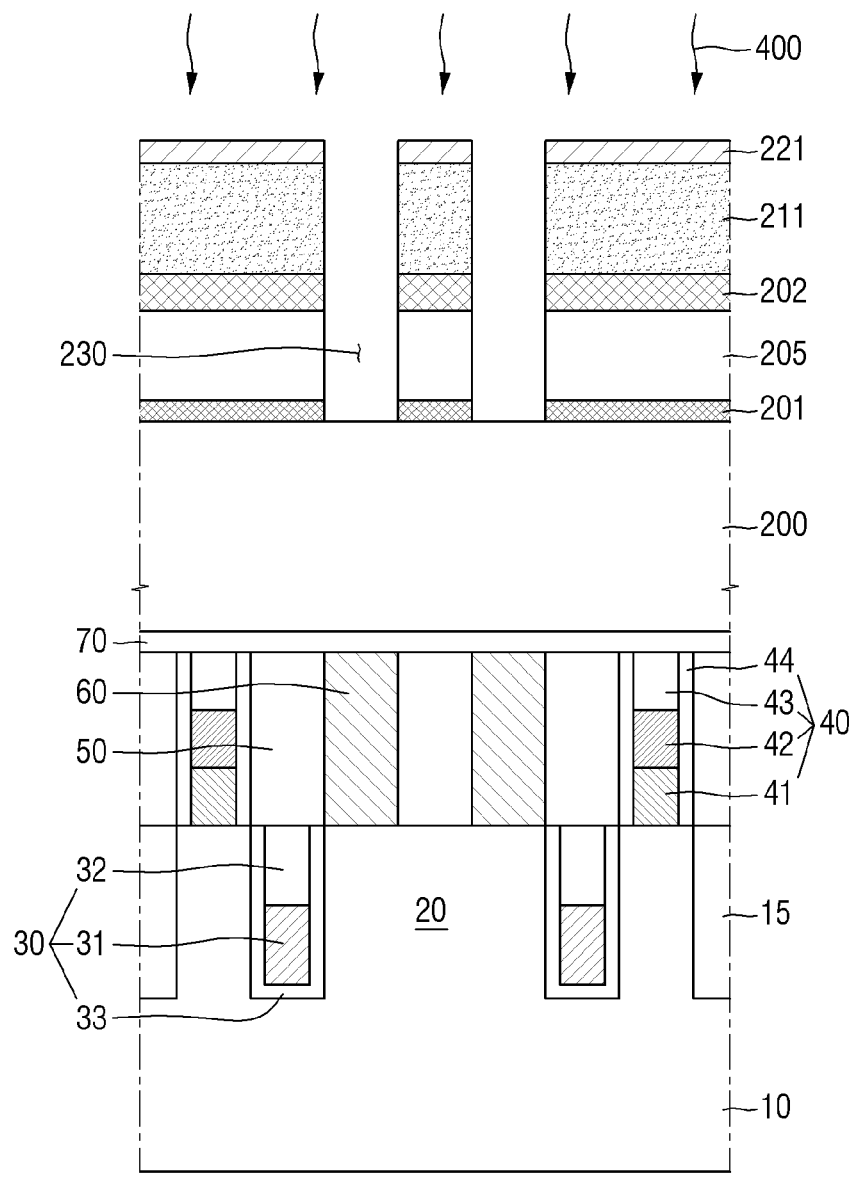

Referring to FIG. 10, a first etch process 400 of etching the upper supporter film 202 and the second oxide film 205 may be carried out by using the second mask film pattern 221 as an etch mask.

In some embodiments of the present disclosure, a part of the lower supporter film 201 may be etched when the second oxide film 205 is etched.

As a result of the first etch process 400, a first hole 230 may be formed that penetrates the upper supporter film 202, the second oxide film 205 and the lower supporter film 201.

During the first etch process 400, an etchant for etching the upper supporter film 202, the second oxide film 205 and the lower supporter film 201 may include, for example, $C_4F_8$ or $C_4F_6$ gas or a mixed gas thereof.

As described above with respect to the above-described exemplary embodiment, the second mask film pattern 221 may also be damaged during the first etch process 400, such that the thickness of the second mask film pattern 221 may be reduced. The second mask film pattern 221 may not be completely removed via the first etch process 400.

As a result of the first etch process 400, some portions of the upper surface of the first oxide film 200 may be exposed. Alternatively, some portions of the upper surface of the lower supporter film 201 may be exposed via the first etch process 400.

Figure 11:
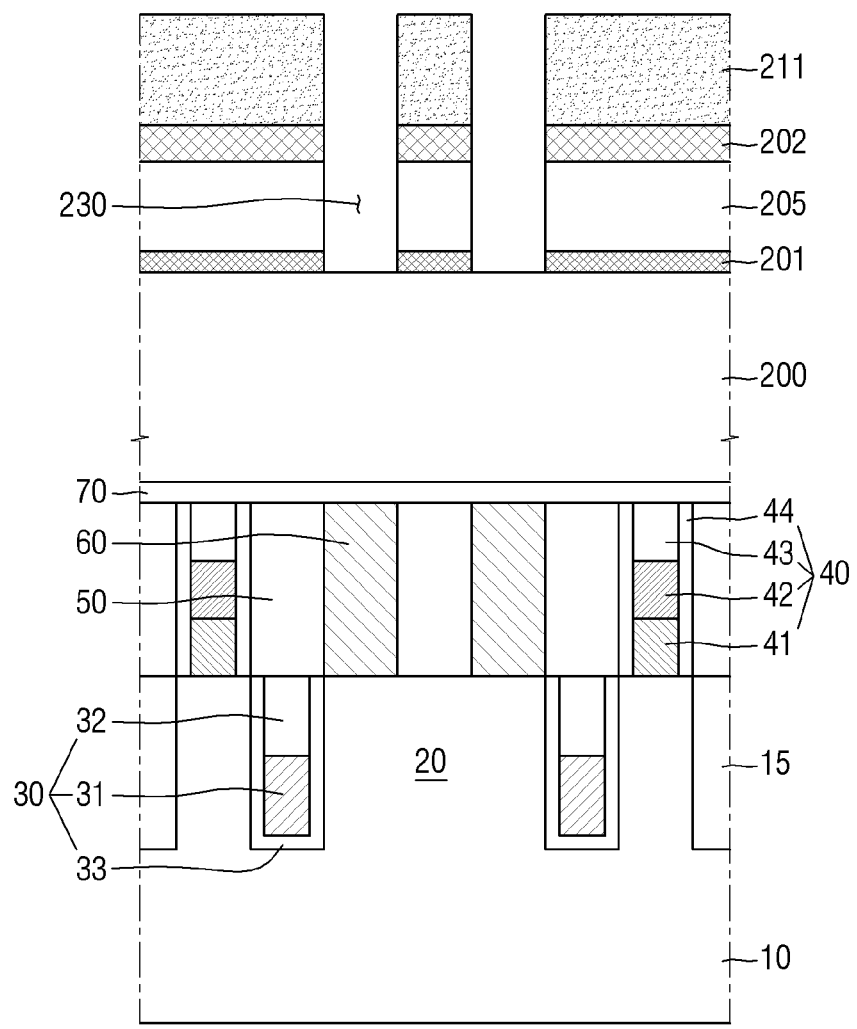

Referring to FIG. 11, the second mask film pattern 221 remaining after the first etch process 400 is completely removed, such that the upper surface of the first mask film pattern 211 is exposed.

The second mask film pattern 221 may be removed by wet etching. For example, the second mask film pattern 221 may be removed by using a mixture of a hot sulfuric acid solution and a SC1 solution. By combining the wet etchants, the second mask film pattern 221 can be completely removed with no damage to the oxide films 200 and 205 and the upper and lower supporter films 201 and 202.

Figure 12:
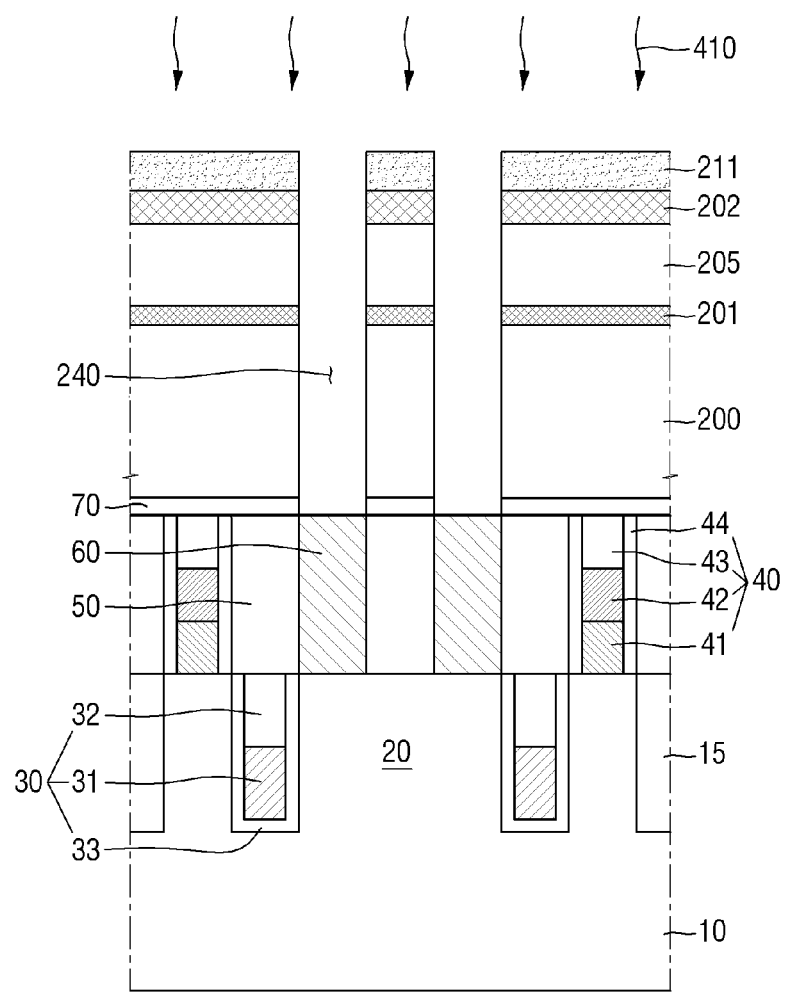

Referring to FIG. 12, a second etch process 410 of etching the first oxide film 200 may be carried out by using the first mask film pattern 211 as an etch mask. As a result of the second etch process 410, a second hole 240 may be formed that penetrates the oxide films 200 and 205 and the upper and lower supporter films 201 and 202 completely.

Performing the second etch process 410 may include removing the stopping insulation film 70 under the oxide film 200. As some portions of the stopping insulation film 70 covering the landing pad 60 are removed, the upper surface of the landing pad 60 may be exposed.

During the second etch process 410, the first mask film pattern 211 may be damaged, such that the thickness of the first mask film pattern 211 may be reduced.

During the second etch process 410, an etchant for etching the first oxide film 200 and the stopping insulation film 70 may include, for example, $C_4F_8$ or $C_4F_6$ gas or a mixed gas thereof.

Like the above-described exemplary embodiment, in the method of fabricating a semiconductor device according to the another exemplary embodiment of the present disclosure, the second hole 240 having a high aspect ratio is formed by using the first and second mask films 211 and 221 having different etch selectivities with respect to the oxide films 200 and 205.

For example, the first etch process 400 of etching the second oxide film 205 is carried out by using the second mask film pattern 221 which includes a metal mask film and thus has a high etch selectivity with respect to the oxide films 200 and 205, and then the second etch process 310 of etching the first oxide film 200 is carried out by using the first mask film pattern 211 which includes a silicon mask film.

By doing so, the second hole 240 having a high aspect ratio can be formed, and the CD non-uniformity that may occur during the etching with the second mask film 221 can be mitigated by the second etch process 410 with the first mask film 211.

Figure 13:
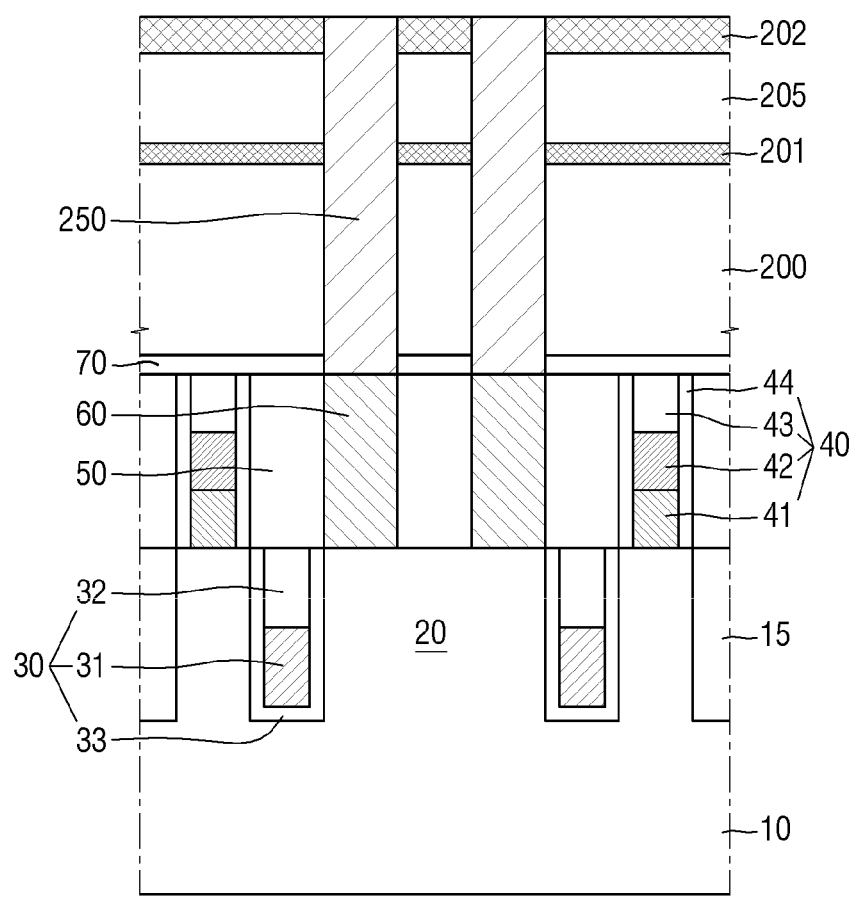

Subsequently, referring to FIG. 13, a lower electrode 250 is formed in the second hole 240. Forming the lower electrode 250 may include, for example, filling the second hole 240 with a conductive material, and then removing the conductive material on the upper surface of the upper supporter film 202 via an etch-back process or chemical mechanical polishing (CMP), etc.

Some portions of the side walls of the lower electrode 250 may come in contact with the lower supporter film 201 and the upper supporter film 202. Accordingly, the lower electrode 250 may be supported by the lower supporter film 201 and the upper supporter film 202.

Figure 14:
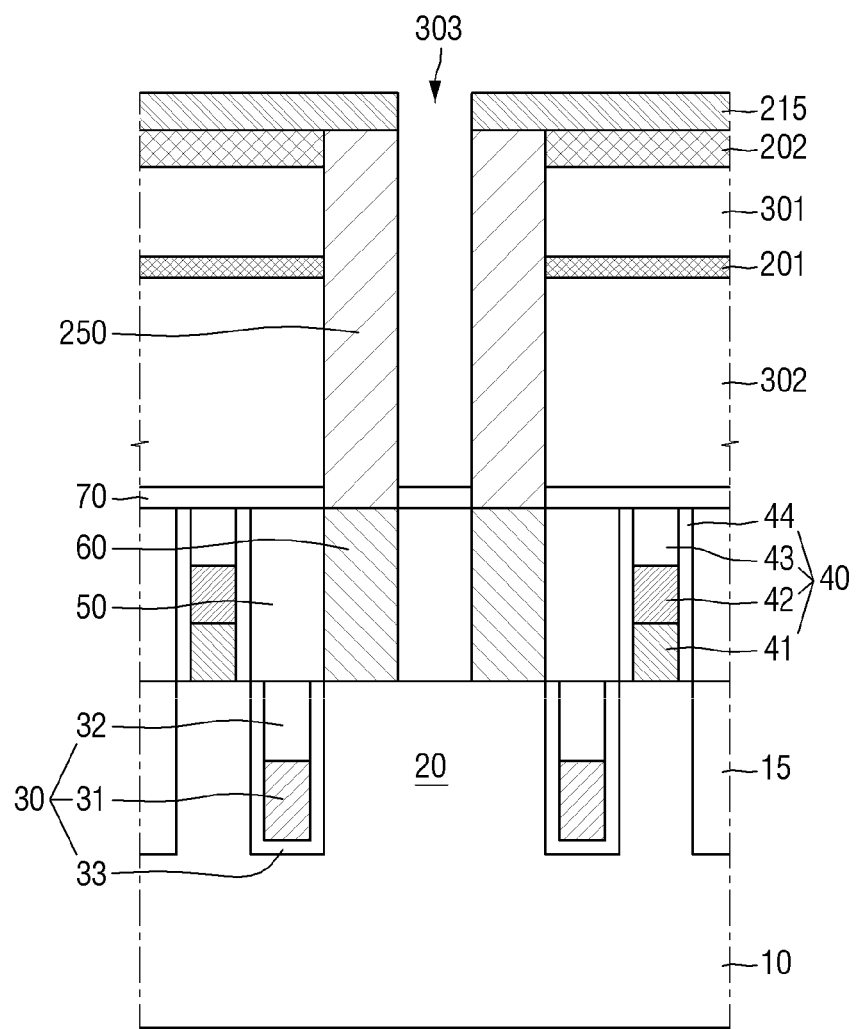

Referring to FIG. 14, a third mask pattern 215 is formed such that it covers the upper supporter film 202 and the lower electrode 250. Then, the upper supporter film 202, the lower supporter film 201, the second oxide film 205 and the first oxide film 200 are removed via an opening 303 in the third mask film pattern 215.

The third mask pattern 215 includes the opening 303 overlapping the area between the two lower electrodes 250.

Removing the upper supporter film 202, the lower supporter film 201, the second oxide film 205 and the first oxide film 200 may include removing them by injecting $C_4F_8$ or $C_4F_6$ gas or a mixed gas thereof via the opening 303.

As the first oxide film 200 and the second oxide film 205 are removed, cavities 301 and 302 surrounded by the lower electrode 250 and the upper and lower supporter films 201 and 202 may be formed.

Figure 15:
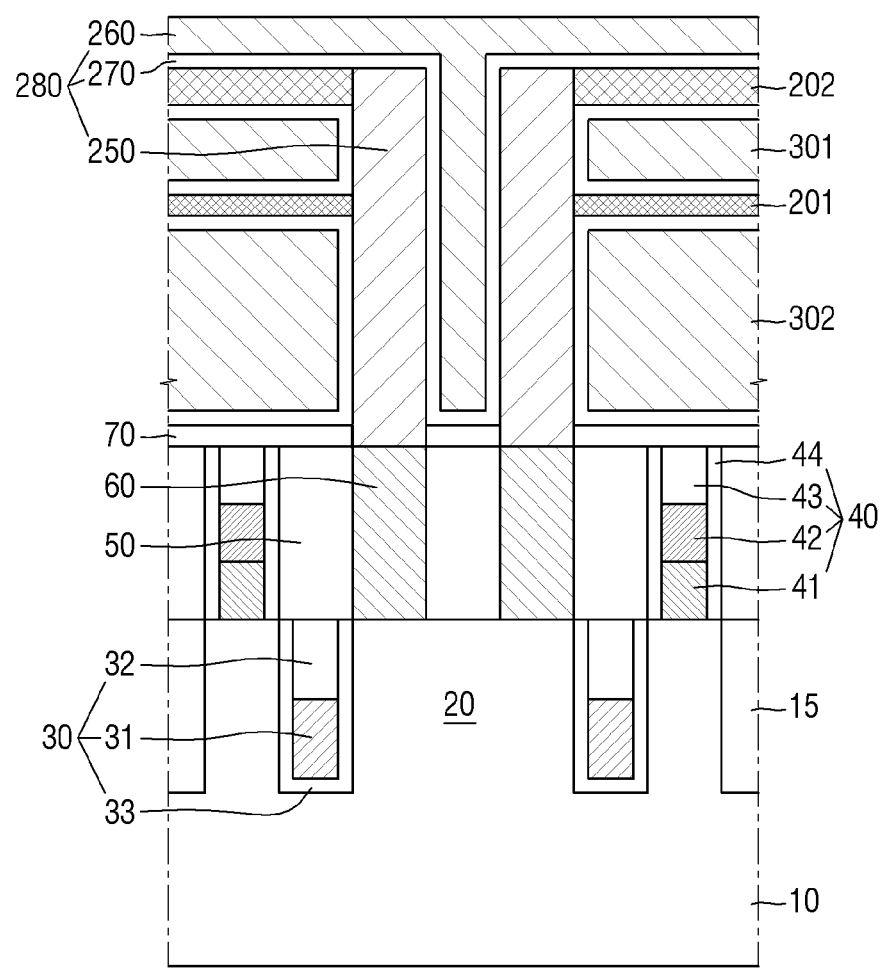

Subsequently, referring to FIG. 15, the third mask film pattern 215 is removed. Then, a dielectric film 270 is formed conformally over the lower electrode 250 and the upper and lower support films 201 and 202, and an upper electrode 260 is formed on the dielectric film.

The dielectric film 270 may be formed conformally on the inner walls of the cavities 301 and 302 formed after the oxide films 200 and 205 are removed.

By forming the lower electrode 250, the upper electrode 260 and the dielectric film 270, the capacitor 280 is formed.

As described above, by the method of fabricating a semiconductor device according to the another exemplary embodiment of the present disclosure, it is possible to form the second hole 240 having a high aspect ratio and the lower electrode 250 with which the second hole 240 is filled, thereby forming the capacitor 280 having a high aspect ratio. The capacitor 280 having a high aspect ratio can have increased capacitance and can improve the operation reliability of the semiconductor device.

The embodiments of the present disclosure have been described with reference to the attached drawings, but it may be understood by one of ordinary skill in the art that the present disclosure may be performed one of ordinary skill in the art in other specific forms without changing the technical concept or essential features of the present disclosure. Further, the above-described embodiments are merely examples and do not limit the scope of the rights of the present disclosure.

What is claimed is:

1. A method of fabricating a semiconductor device, the method comprising:
   forming an insulation film on a target layer;
   forming a first mask film on the insulation film, wherein the first mask film contains a semiconductor material and has a first thickness and a first etch selectivity with respect to the insulation film;
   forming a second mask film on the first mask film, wherein the second mask film contains a metal and has a second thickness smaller than the first thickness and a second etch selectivity with respect to the insulation film larger than the first etch selectivity;
   forming a second mask film pattern by patterning the second mask film;
   forming a first mask film pattern by patterning the first mask film;
   etching first portions of the insulation film by using the second mask film pattern as a first etch mask film; and
   etching second portions of the insulation film by using the first mask film pattern as a second etch mask film to form a hole, wherein the target layer is exposed via the hole.

2. The method of claim 1, further comprising:
completely removing the second mask film pattern after the etching the first portions of the insulation film by using the second mask film pattern as the first etch mask film.

3. The method of claim 2, wherein the removing the second mask film pattern comprises removing the second mask film pattern by wet etching.

4. The method of claim 1, wherein the first thickness is between two to three times the second thickness.

5. The method of claim 1, wherein the insulation film comprises a first insulation film and a second insulation film formed on the first insulation film, and
wherein the forming the insulation film on the target layer comprises:
forming a lower supporter film interposed between the first insulation film and the second insulation film, and
forming an upper supporter film interposed between the second insulation film and the first mask film.

6. The method of claim 5, wherein each of the upper supporter film and the lower supporter film comprises a silicon oxynitride film.

7. The method of claim 1, wherein the first mask film comprises a silicon mask film, and the second mask film comprises a metal mask film.

8. The method of claim 7, wherein the forming the first mask film comprises depositing a silicon and/or a doped silicon.

9. The method of claim 7, wherein the forming the second mask film comprises depositing at least one of tungsten, tungsten nitride, tungsten carbide, aluminum, aluminum oxide, titanium, titanium oxide and tungsten silicide.

10. The method of claim 1, further comprising:
forming a lower electrode to fill a second hole;
removing the insulation film;
forming a dielectric layer conformally over the lower electrode and the target layer; and
forming an upper electrode on the dielectric layer.

11. A method of fabricating a semiconductor device, the method comprising:
forming an oxide film on a target layer;
forming a first mask film on the oxide film, wherein the first mask film contains a semiconductor material and has a first etch selectivity with respect to the oxide film;
forming a second mask film on the first mask film, wherein the second mask film contains a metal and a second etch selectivity with respect to the oxide film larger than the first etch selectivity;
forming a second mask film pattern by patterning the second mask film;
forming a first mask film pattern by patterning the first mask film;
etching first portions of the oxide film by using the second mask film pattern as a first etch mask film; and
etching second portions of the oxide film by using the first mask film pattern as a second etch mask film to form a hole, wherein the target layer is exposed via the hole.

12. The method of claim 11, wherein the first mask film has a first thickness and the second mask film has a second thickness smaller than the first thickness.

13. The method of claim 11, further comprising:
completely removing the second mask film pattern after the etching the first portions of the oxide film by using the second mask film pattern as the first etch mask film.

14. The method of claim 11, wherein the oxide film comprises a first oxide film and a second oxide film formed on the first oxide film, and
wherein the forming the oxide film on the target layer comprises:
forming a lower supporter film interposed between the first oxide film and the second oxide film, and
forming an upper supporter film interposed between the second oxide film and the first mask film.

15. The method of claim 11, further comprising:
forming a lower electrode to fill a second hole;
removing the oxide film;
forming a dielectric layer conformally over the lower electrode and the target layer; and
forming an upper electrode on the dielectric layer.

16. A method of fabricating a semiconductor device, the method comprising:
forming an isolating film to define an active area in a substrate;
forming a gate in the active area;
forming an interlayer insulation film on the substrate, a bit line feature, and a landing pad in the interlayer insulation film, wherein the landing pad is electrically connected to the active area;
forming an oxide film on the interlayer insulation film;
forming a first mask film pattern on the oxide film and a second mask film pattern on the first mask film pattern;
exposing the landing pad by etching the oxide film by using the first and second mask film patterns; and
forming a capacitor electrically connected to the landing pad on the landing pad.

17. The method of claim 16, wherein the first mask film pattern has a first thickness, and the second mask film pattern has a second thickness smaller than the first thickness.

18. The method of claim 16, wherein forming the capacitor comprises:
forming a lower electrode on the landing pad;
removing the oxide film;
forming a dielectric layer conformally over the lower electrode and a target layer; and
forming an upper electrode on the dielectric layer.

19. The method of claim 16, wherein the first mask film pattern contains an oxide film containing silicon or nitride; and the second mask film pattern contains an oxide film contains metal.

20. The method of claim 16, wherein the first mask film pattern has a first etch selectivity with respect to the oxide film, and the second mask film pattern has a second etch selectivity with respect to the oxide film, wherein the second etch selectivity is larger than the first etch selectivity.

* * * * *